United States Patent [19]

Henry

[11] 3,992,611
[45] Nov. 16, 1976

[54] PLUS FIVE AND INVERT ALGORITHM

[75] Inventor: Tim W. Henry, Tempe, Ariz.

[73] Assignee: Motorola Inc., Chicago, Ill.

[22] Filed: Apr. 21, 1975

[21] Appl. No.: 569,900

[52] U.S. Cl. .................. 235/92 EV; 235/92 CM; 235/92 CP; 235/92 R
[51] Int. Cl.² .......................................... G06M 3/14
[58] Field of Search ...... 235/92 EV, 92 CM, 92 CP; 328/44, 158; 307/222 R

[56] References Cited
UNITED STATES PATENTS

| | | | |
|---|---|---|---|
| 3,145,293 | 8/1964 | Homan | 235/92 CM |
| 3,651,415 | 3/1972 | Glasson | 235/92 CM |
| 3,704,361 | 11/1972 | Patterson | 235/92 CP |

Primary Examiner—Joseph M. Thesz
Attorney, Agent, or Firm—Eugene A. Parsons; Harry M. Weiss

[57] ABSTRACT

A four bit binary coded decimal (BCD) up/down counter includes a four bit adder and associated logic circuitry configured to feed therethrough the incoming BCD code words as the actual output for the up count and for the down count, add binary 5 to the incoming BCD code word for 1 through 9 and invert each bit of the resulting code words, and feeding the BCD code word for zero directly to the output.

5 Claims, 2 Drawing Figures

PLUS FIVE AND INVERT ALGORITHM

This invention relates to a binary coded decimal (BCD) up/down counter and more particularly, an improved four bit BCD up/down counter.

Conventional BCD up/down counters include a large number of gates that are configured in the form of a complex circuitry for implementing the up/down count operations.

Accordingly, it is an object of the present invention to provide an improved up/down counter and more particularly, to provide a simplified and improved four bit BCD up/down counter.

Aforementioned and other objects of the present invention is achieved, in accordance with the present invention, by a four bit BCD up/down counter which includes input means for receiving an incoming BCD code words for zero through nine, output means, means providing an up count or down count command signal, circuitry interposed between said input and said output means for feeding the incoming BCD code words therethrough as is in response to the up count command signal and adding binary code for 5 to the incoming BCD code words 1 through 9 and inverting each bit of the resulting BCD code words and retaining the input BCD code word for 0 as is, in response to the down count command signal, and output means for providing the up count and down count BCD code word output in response to the up and down count command signal selectively.

In accordance with another feature of the present invention, the four bit BCD up/down counter of the present invention may be advantageously used in conjunction with multiplexing and demultiplexing means for handling BCD codes for multidigit decimal numbers.

The aforementioned and other objects and features of the present invention will become clearer from the following detailed description of illustrative embodiments of the present invention in conjunction with the accompanying drawings.

DETAILED DESCRIPTION

In accordance with the present invention, the up/down counter is configured to implement the following algorithm in providing the up and down count of the incoming BCD code words 0 through 9. The algorithm involved in the present up/down counter can be graphically illustrated by a table of the code bits involved in the up/down counter process as follows:

| BCD UP | DECIMAL NUMBERS | BCD + 5 | INVERT | DECIMAL NUMBERS |
|---|---|---|---|---|
| 0000 | 0 | 0000 | 0000 | 0 |
| 0001 | 1 | 0110 | 1001 | 9 |
| 0010 | 2 | 0111 | 1000 | 8 |
| 0011 | 3 | 1000 | 0111 | 7 |
| 0100 | 4 | 1001 | 0110 | 6 |
| 0101 | 5 | 1010 | 0101 | 5 |
| 0110 | 6 | 1011 | 0100 | 4 |
| 0111 | 7 | 1100 | 0011 | 3 |
| 1000 | 8 | 1101 | 0010 | 2 |
| 1001 | 9 | 1110 | 0001 | 1 |

As shown in the left column above, the conventional BCD code for decimal numbers 0–9 may be presented in the form of four bit codes. The present up/down counter is configured to feed the BCD codes for the decimal numbers 0–9 as is therethrough to the output. For the down count process the binary code word for decimal number zero, i.e., BCD code 0000, is fed through the counter as is to the output. This is shown in the first row of the table above. And for the BCD codes for the decimal numbers 1–9, the down count is attained according to the following. First, binary code for the decimal number 5, namely, 0101, is added to each code words. The resulting code words are shown in the middle column under the heading BCD + 5. Each bit of the resulting BCD code words for the decimal numbers 1–9 are then inverted. The result of the inversion is in the column at the right hand side under the heading INVERT. Note that the resulting code words after the inversion represents the BCD code word in down count sequence as opposed to the up count sequence of the BCD codes shown in the extreme left column. So in the application, for the down count operation, if the incoming code words are in the form of BCD up count sequence, 0,1,2,3,4,5,6,7,8, and 9, then the resulting output BCD code words will be in the down count sequence, of 0,9,8,7,6,5,4,3,2, and 1 by imposing BCD + 5 and inversion on the incoming code words as described above. If the count is for the up count, then the incoming BCD codes for 0–9 are fed through the counter as is.

Figure 1:
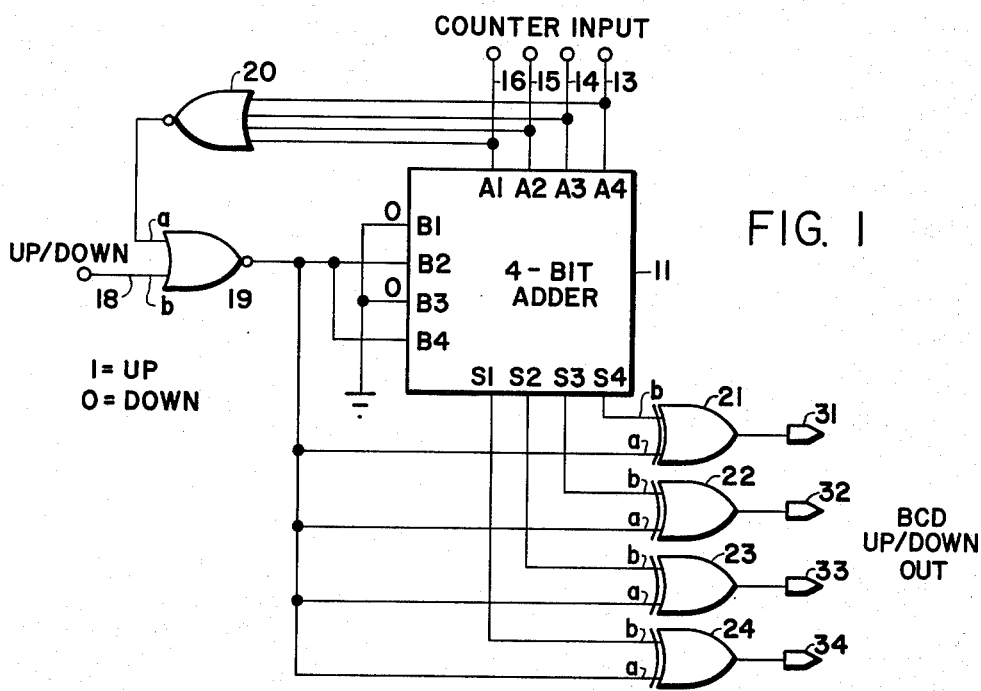
FIG. 1 shows a schematic diagram of an illustrative BCD up/down counter according to the present invention.

The aforementioned mathematical algorithm is advantageously implemented by a counter circuit schematically illustrated in FIG. 1. As shown the counter comprises a four bit adder 11 and a plurality of logic gates operatively connected to implement the logical operations required by the algorithm for providing the up count and down count. More particularly, the counter includes input means 13–16 for receiving the four bit up count BCD and apply them to the four bit adder 11. There is also provided an up/down command signal input means 18, the up count command signal may be in the form of logical 1 and the down count command signal may be in the form of logical 0 applied to the counter. There are provided a pair of NOR gates 19 and 20 connected as shown to provide the logical functions as shall be explained hereinbelow. The NOR gate 20 is interposed between one of the input $a$ of the NOR gate 19 and the input means 13–16 for the four input bits. The up/down command signal is applied to the other input $b$ of the NOR gate 19. The output of the NOR gate 20 connected to four OR gates 21 through 24 at one of their inputs, $a$'s, as illustrated. The four bit adder 11 may be of any conventional design configured to add a first four bit digital word to a second four bit digital word and provide a sum in the output. Thus, it may be configured to receive the four bits from the four bit input leads 13–16 applied to the four bit adder at the terminals designated B1, B2, B3 and B4. The four bits from A1, A2, A3 and A4 are added to the other four bits of the second four bit code words from the other four bit input terminals B1, B2, B3 and B4.

In accordance with the present invention, second four bit words, are used to provide BCD+5 and inversion for the down count as follows. First and third bit positions, i.e., B1 and B3 are grounded to provide logical 0 always. On the other hand, the second and fourth input terminals B2 and B4 are connected to the output of the NOR gate 19. Hence, the two terminals A2 and A4 are under the control of the NOR gate 19, and receives the logical signal of either 0 or 1 depending upon the output of the gate 19. The gate 19 provides logical 0 when the count operation is for the up count. This is achieved by providing a command signal of logical 1 for the up count signal. In turn, the NOR gate 19 provides logical 0 output which causes the A2 and A4 bit positions to be logical 0. Consequently, the four bits applied to the input terminals at B1, B2, and B3, and B4 are all logical 0. As a result, the four bit adder feeds in effect, the incoming four bit codes from the other four bit input terminals A1, A2, A3 and A4 as is, therethrough to the output summing terminals S1, S2, S3 and S4. The four bit output of the four bit adder are then fed to the second input $b$ or the other input terminals of the OR gates 21 through 24. Since the gate output of the NOR gate 19 is logical 0, the output of the OR gates 21–24 are the same as the input at the other input terminals $b$, i.e., the output of the summing terminals S1, S2, S3, and S4. Consequently, with the up command signal of logical 1, the counter feeds the incoming four bit up count BCD words therethrough to the outputs of OR gates 21–24 as is. Accordingly,, the output of the counter circuitry at the output terminals 31, 32, 33 and 34 are the same as the input code words applied to the input terminals 13.

Now for the down count process, the gates 19–24 and the down count command signal of logical 0 serves the purpose of enabling the four bit adder to down count the incoming four bit code words as follows. With any combination of code bits, except for the code words for the number 0 the NOR gate 20 provides logical 0 output. This is applied to the input $a$ of the NOR gate 19. Since the down count command signal is logical 0 the output of the NOR gate 19 becomes logical 1. This means that the four bit input applied to the terminals A2 and A4 becomes logical 1. Thus, the four bits for the four bit terminals B1, B2, B3 and B4 become four bit code words that represent decimal number 5, namely, 0101. The four bit adder serves its conventional summing function of adding this four bit word 0101 to the incoming four bit code words 1–9 and provides the summed outputs through the output terminals S1, S2, S3 and S4. The output at the summing terminals S1 through S4 appears in the form of the BCD + 5 column shown in the middle in the above table. Now the output of the NOR gate 19 in the form of logical 1 is applied to terminal $a$ of OR gates 21–24. In turn, the OR gates 21–24 serves the function of inverting the output of the four summing output terminals S1–S4 applied to the $b$ terminals, thereof. Each bit of the output of the terminals S1–S4 are inverted by the logical function of the OR gate 21–24. The inverted output applied to the output terminals 31 through 34. This is shown in the column on the right hand side in the above table under the heading INVERT.

Note that for the BCD code word for decimal number 0 in the down count operation, the NOR gates 19 and 20 serve the function of providing logical 0 to the terminals B2 and B4 of the four bit input terminals. Thus, the down count command is applied to logical 0 the terminal $b$ of NOR gate 19 and logical output of logical 1 is applied by the NOR gate 20 at the input terminal when all four input bits at the input bits at the input terminals 13–16 are logical 0, the all four input bits at the input terminals 13 are logical 0. Consequently, NOR gate 19 provides logical 0 output. Hence, the four second bit input at B1, B2, B3 and B4 provide BCD code word for zero, i.e., 0000. Hence, the four bit adder feeds therethrough the four bit code word for decimal 0 to the summing output terminals S1–S4 in the form of a BCD code word for 0. The OR gates 21–24 do not serve the function of inverting the BCD code word for 0 at this point, since the output at the NOR gate 19 is logical 0.

In summary, it has been shown above that a counter having a four bit adder and associated logical gates 19–24 are configured to implement the aforementioned mathematical algorithm in providing the up count or down count in response to the up count or down count command signal. Thus, the counter is designed so that in response to the up count command signal, its four bit adder and the associated logic circuitry feed the input therethrough as is as the output. However, in response to down count input command signals, the counter adds BCD code word for 5 to the incoming code words for 1–9 and invert each bit of the resulting summed code words to provide the down count output. The four bit adder and associated logic gates are also configured so that the BCD code word for decimal 0 is fed therethrough as is and applied to the output terminal as BCD code word 0 for the down count operation.

Figure 2:
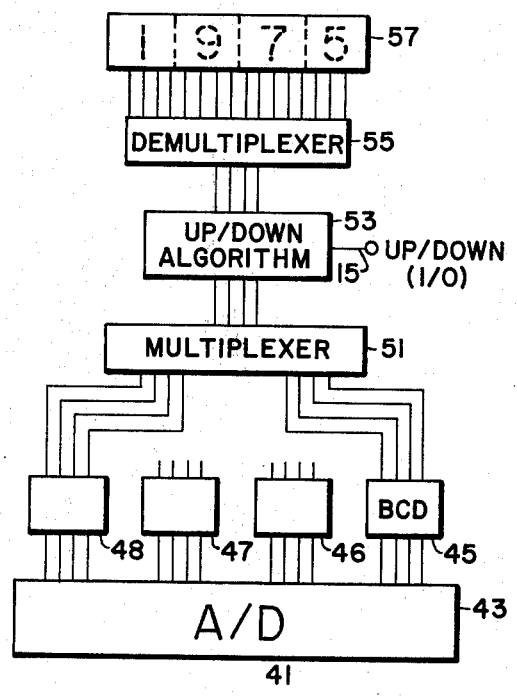
FIG. 2 shows use of such a counter in conjunction with a multiplexer and demultiplexer for handling multidigit decimal numbers.

In accordance with another aspect of the present invention, the aforementioned up/down counter may be advantageously utilized to handle the up/down counting process for multidigit numbers as illustrated in FIG. 2 where an application of the up/down counter of the present invention is illustrated schematically in a digital volt meter application. As illustrated in FIG. 2, a digital volt meter includes a conventional analog-to-digital converter 43 for converting an analog signal applied thereto from a suitable signal source via a input path 41. The converted digital signal is then converted into BCD format. For example, the volt meter may be designed to show four digit readings. So four BCD encoders 45–48 representing four digit decimal numbers may be used to show the read out in four BCD codes. The encoder outputs are multiplexed in succession via a suitable conventional multiplexer 51 and then applied to the up/down counter in accordance with the present invention. The counter up counts or down counts the multiplexed BCD codes in response to the up/down command signals applied thereto. In turn, a demultiplexer 55 provided for demultiplexing the output of the up/down counter 53 demultiplexes and applies the output to the appropriate position of the decimal output indicating means 57 which may be in the form of conventional decoder/visual display means combination that shows the reading in visual decimal numbers. As configured, the multiplexer 51 and demultiplexer 55 may be of a suitable design configured to operate on the BCD code words in ascending or descending order for the decimal display output at 57 depending upon the up or down command signals applied to the command signal of the input terminal 15.

Various modifications and changes may be made to the present invention by one of ordinary skill without departing from the spirit and scope of the present invention as described above and encompassed in the accompanying claims.

What is claimed is:

1. A four-bit binary coded decimal (BCD) conversion circuitry for converting an input BCD code word into an output BCD code word, said conversion circuitry comprising:

a four-bit adder, input means for applying the input BCD code word to said four-bit adder, output means for sending out an output BCD code word from said four-bit adder, means for providing an "up" and "down" command signal selectively, and logic circuitry responsive to the up command signal and an input BCD code word for enabling said four-bit adder and said output means to provide an output BCD code word which is the same as the input BCD code word whereby the output BCD code word for decimal numbers 1, 2, 3, 4, 5, 6, 7, 8, or 9 is sent out which is the same as the input BCD code word and said logic circuitry is also responsive to the down command signal and an input BCD code word for enabling said four-bit adder and said output means to provide an output BCD code word which is the 9's complement of the input BCD code word, whereby the input BCD code word for decimals 1, 2, 3, 4, 5, 6, 7, 8, or 9 is complemented into a BCD code word for decimal number 9, 8, 7, 6, 5, 4, 3, 2, or 1 respectively and sent out as the output BCD code word and said circuitry responsive to the up command or down command signal and input BCD code word 0 for enabling said four-bit adder and said output means to provide an output BCD code word 0.

2. The circuitry according to claim 1, wherein said four-bit adder includes four-bit input terminals for receiving the four-bit input BCD code word and four-bit output terminals, and said logic circuitry includes:

first NOR gate with first and second input terminals, said first input terminal for receiving the up or down command signal, second NOR gate with the input thereof coupled to receive the input BCD code word and the output thereof coupled to the second input terminal of said first NOR gate, four-bit control terminals for said four-bit adder wherein first and third bit control terminals thereof are grounded and second and fourth bit control terminals thereof are coupled to the output of said first NOR gate, and four OR gates for ORing the four-bit output from the four-bit output terminals of the four-bit adder respectively with the output of the first comprising gate.

3. A multidigit up/down counter interposable between a plurality of four-bit BCD signal sources for providing a multidigit BCD words and a multidigit decimal display means, comprising means for multiplexing the plurality of four-bit BCD signals from said plurality of four-bit BCD signal sources;

means for demultiplexing the multiplexed multidigit BCD signals and applying the demultiplexed output to said multidigit decimal display means;

means for providing an up and a down command signal selectively, a four-bit binary coded decimal conversion circuitry interposed between said multiplexing and said demultiplexing means for applying the incoming multiplexed BCD code words as is, one word at a time, to said demultiplexing means in response to the up command signal to obtain up count and converting each of the multiplexed BCD code words into its 9's complement in response to the down command signal and applying the complement, one word at a time, to said demultiplexing means to obtain down count and providing output BCD code word 0 in response to input BCD code word 0 and the up or down command signal.

4. The counter according to claim 3, wherein said BCD conversion circuitry includes:

a four-bit adder, input means to said four-bit adder for applying the multiplexed four-bit BCD code words, one word at a time, to said four-bit adder, means for receiving the up and down command signal selectively, output means for applying the four-bit BCD code word output of the four-bit adder to said demultiplexing means, and logic circuitry for enabling said four-bit adder and said output means to effect the code conversion.

5. The counter according to claim 4, wherein said logic circuitry includes:

first NOR gate with first and second input terminals, said first input terminal for receiving the up and down command signal selectively, second NOR gate with the input thereof coupled to receive the input BCD code word and the output thereof coupled to the second input terminal of said first NOR gate, four-bit control terminals for said four-bit adder wherein first and third bit control terminals thereof are grounded and second and fourth bit control terminals thereof are coupled to the output of said first NOR gate, and four OR gates for ORing the four-bit output of the four-bit adder respectively with the output of the first NOR gate.

* * * * *